(12) United States Patent
Seo et al.

(10) Patent No.: US 7,917,834 B2
(45) Date of Patent: Mar. 29, 2011

(54) APPARATUS AND METHOD FOR COMPUTING LLR

(75) Inventors: Jong Hyun Seo, Daejeon (KR); Byung Jo Kim, Daejeon (KR); Seong Su Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1146 days.

(21) Appl. No.: 11/635,366

(22) Filed: Dec. 7, 2006

(65) Prior Publication Data

US 2007/0136649 A1 Jun. 14, 2007

(30) Foreign Application Priority Data

Dec. 8, 2005 (KR) ................. 2005-119388
Sep. 11, 2006 (KR) ................. 2006-87422

(51) Int. Cl.
*H03M 13/00* (2006.01)

(52) U.S. Cl. ........................ 714/794; 714/796

(58) Field of Classification Search .............. 714/794, 714/752, 796, 755, 795, 792, 786
See application file for complete search history.

(56) References Cited

U.S. PATENT DOCUMENTS

| | | | |
|---|---|---|---|
| 6,304,996 B1 | 10/2001 | Van Stralen et al. | |
| 6,516,437 B1 | 2/2003 | Van Stralen et al. | |
| 7,246,298 B2 * | 7/2007 | Chiueh et al. | 714/755 |
| 7,464,316 B2 * | 12/2008 | Bickerstaff et al. | 714/755 |
| 7,571,369 B2 * | 8/2009 | Wang et al. | 714/755 |
| 2004/0205445 A1 * | 10/2004 | Xu | 714/792 |
| 2007/0050694 A1 * | 3/2007 | Bickerstaff et al. | 714/752 |

FOREIGN PATENT DOCUMENTS

| | | |
|---|---|---|
| EP | 1154578 | 11/2001 |
| EP | 1383246 | 1/2004 |
| KR | 10-2000-0005787 | 6/1999 |
| KR | 10-2000-0021055 | 4/2000 |
| KR | 10-2005-0042869 | 5/2000 |
| KR | 10-2000-0073312 | 12/2000 |
| KR | 10-2001-0091163 | 10/2001 |
| KR | 10-2003-0042687 | 6/2003 |
| KR | 10-2005-0111842 | 5/2004 |
| KR | 10-2005-0111843 | 5/2004 |
| KR | 10-2004-0096355 | 11/2004 |

* cited by examiner

*Primary Examiner* — Fritz Alphonse
(74) *Attorney, Agent, or Firm* — LRK Patent Law Firm

(57) ABSTRACT

Provided are an apparatus and method for efficiently computing a log likelihood ratio (LLR) using the maximum a posteriori (MAP) algorithm known as block combining. The method includes the steps of: calculating alpha values, beta values and gamma values of at least two time sections; calculating transition probabilities of respective states in the at least two time sections; performing a comparison operation for some of the transition probabilities to determine the highest value, selecting one of the other transition probabilities according to the determined high value, comparing the determined value with the selected value to select the higher value, and thereby obtaining the highest of the transition probabilities; and determining an operation to apply according to the highest transition probability and calculating an LLR.

10 Claims, 4 Drawing Sheets

APPARATUS AND METHOD FOR COMPUTING LLR

CROSS-REFERENCE TO-RELATED APPLICATION

This application claims priority to and the benefit of Korean Patent Application Nos. 2005-119388, filed Dec. 8, 2005, and 2006-87422, filed Sep. 11, 2006, the disclosures of which are incorporated herein by reference in their entirety.

BACKGROUND

1. Field of the Invention

The present invention relates to an apparatus and method for efficiently computing a log likelihood ratio (LLR) using an improved maximum a posteriori (MAP) algorithm known as block combining.

2. Discussion of Related Art

The ongoing development of communication systems has generated demand for a high-speed channel coding method reliable for information transmission. However, information loss is caused by noise in a communication channel, fading, interference, and so on. In order to minimize such information loss and correct errors, an error correction code is indispensable. Ever since Shannon published the results of his research in 1948, error correction codes have been widely studied. One type of error correction code known as turbo code, suggested by Berrou, Glavieux and Thitimaishima in 1993, has excellent error correction performance approaching Shannon's limit and thus is being actively researched. Decoding of turbo code restores the original information by repetitive decoding using a MAP decoder or soft-output Viterbi algorithm (SOVA) decoder. In comparison with a SOVA algorithm, a MAP algorithm is more complex but has superior bit error rate (BER) performance and thus is widely used.

Figure 1:
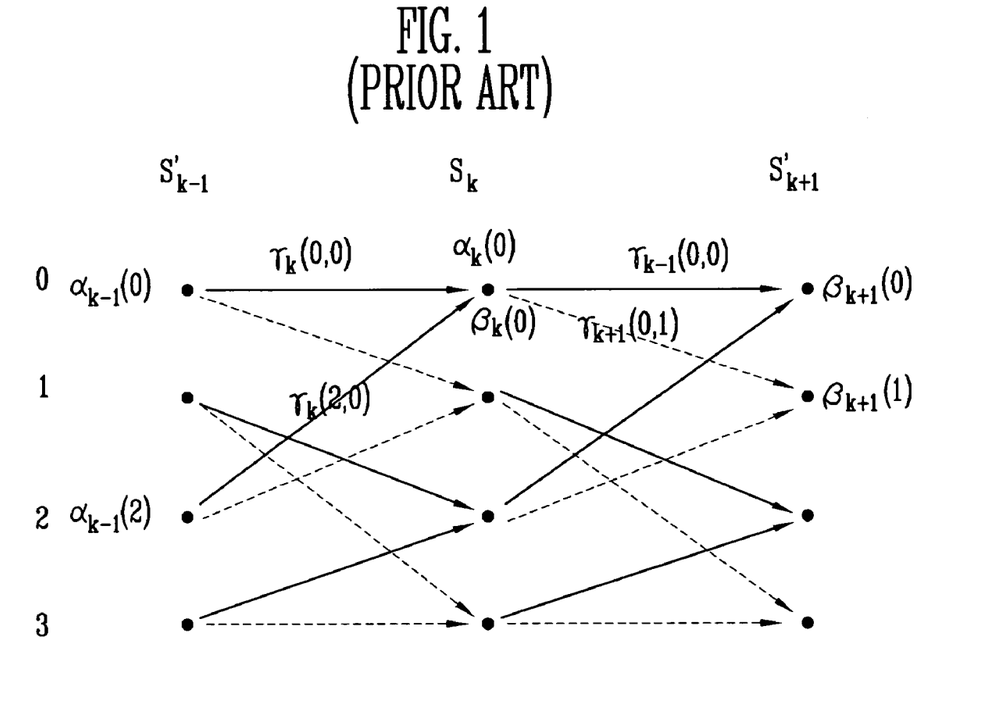
FIG. 1 is a 4-state trellis diagram from time (k−1) to time (k+1) according to conventional art.

The MAP algorithm, first suggested by Bahl, et al. in 1974, calculates an a posteriori probability (APP) from a signal mixed with noise. The MAP decoding algorithm is aimed at determining information bits having the highest probability with respect to a received symbol after data is received. FIG. 1 is a 4-state trellis diagram from time (k−1) to time (k+1).

In FIG. 1, alpha ($\alpha$) is called a forward state metric (FSM) and denotes a state metric for transition of information bits from state S' before time (k−1) to state S after time k. Beta ($\beta$) is called a backward state metric (BSM), and a current beta value can be calculated by repeatedly using a beta value of a previous state after all information is received in the same way as alpha. Gamma ($\gamma$) is defined as a branch metric (BM).

In order to calculate an LLR, a gamma value is calculated using received data, and then an alpha value and a beta value are calculated using the calculated gamma value. In this process, Formulae 1-3 given below are used:

$$\alpha_k(s) = \sum_{all\_s'} \gamma_k(s', s)\alpha_{k-1}(s') \qquad \text{Formula 1}$$

$$\beta_{k-1}(s') = \sum_{all\_s'} \beta_k(s)\gamma_k(s', s) \qquad \text{Formula 2}$$

$$\gamma_k^{s',s} = \exp\left\{\frac{2}{\sigma^2}(x_k u_k + y_k v_k)\right\} \qquad \text{Formula 3}$$

Here, $U_k$ is a data bit and $V_k$ is a parity bit. $X_k$ is a data bit mixed with noise passed through a channel, and $y_k$ is a parity bit mixed with noise passed through a channel. When alpha, beta and gamma values are calculated, an LLR can be calculated using Formulae 4 and 5:

$$L(u_k) = \ln\left(\frac{\sum_{\substack{(s',s)=> \\ u_k=+1}} \alpha_{k-1}(s')\gamma_k(s', s)\beta_k(s)}{\sum_{\substack{(s',s)=> \\ u_k=-1}} \alpha_{k-1}(s')\gamma_k(s', s)\beta_k(s)}\right) \qquad \text{Formula 4}$$

$$L(u_{k+1}) = \ln\left(\frac{\sum_{\substack{(s,s'')=> \\ u_{k+1}=+1}} \alpha_{k-1}(s)\gamma_k(s, s'')\beta_k(s'')}{\sum_{\substack{(s,s'')=> \\ u_{k+1}=-1}} \alpha_{k-1}(s)\gamma_k(s, s'')\beta_k(s'')}\right) \qquad \text{Formula 5}$$

Formulae 4 and 5 enable calculation of LLRs at time k and time (k+1), respectively. Using these formulae, information bits having the highest probability of transition from a previous state to a current state are determined.

However, the MAP algorithm described above requires a large memory size and a significant amount of calculation. Thus, the MAP algorithm imposes heavy restrictions on system design and drives up the cost of system building.

In order to solve the above problem of the MAP algorithm requiring a large memory size, a block processing algorithm has been suggested. The block processing algorithm is a MAP algorithm capable of more efficiently using a memory according to a principle described below.

Figure 2:
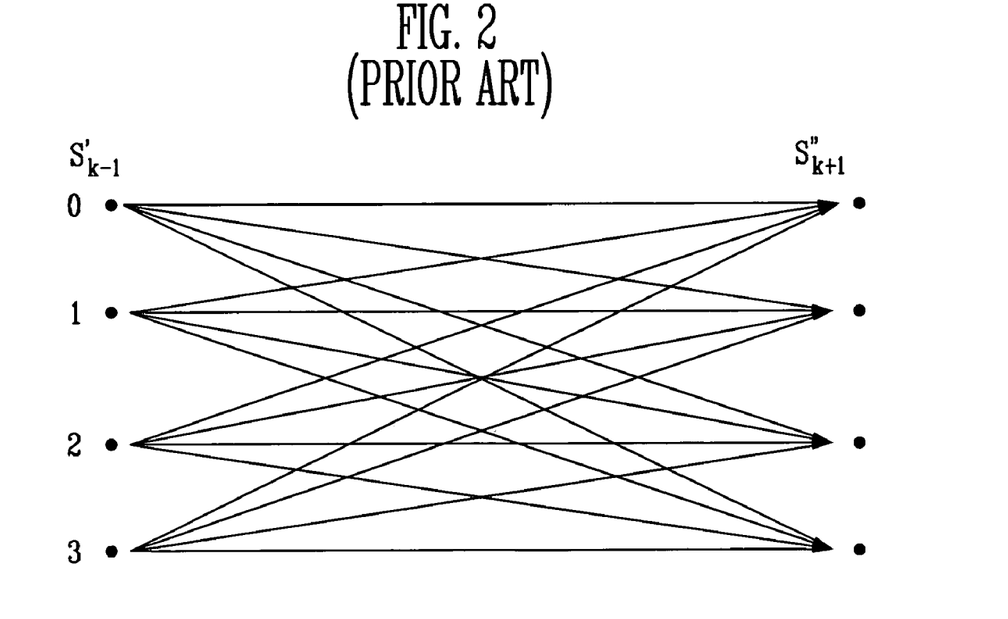
FIG. 2 is a 4-state trellis diagram employing a block processing technique from time (k−1) to time (k+1) according to improved conventional art.

FIG. 2 is a 4-state trellis diagram employing a block processing technique from time (k−1) to time (k+1) according to conventional art. The algorithm using the block processing technique calculates alpha values and beta values from time (k−1) to time (k+1), at time (k+1) rather than at time k. Thus, the algorithm can reduce the amount of memory required to store an alpha value and a beta value at time k in the middle of the process. Alpha and beta values are calculated by Formulae 6 to 8 given below:

$$\alpha_{k+1}(s) = \sum_{all\_s'} \gamma(s', s, s'')\alpha_{k-1}(s') \qquad \text{Formula 6}$$

$$\beta_{k-1}(s') = \sum_{all\_s''} \gamma(s'', s, s')\beta_{k+1}(s'') \qquad \text{Formula 7}$$

$$\gamma(s'', s, s') = \gamma(s'', s)\gamma(s, s') \qquad \text{Formula 8}$$

The algorithm using the block processing technique reduces the number of data access operations by efficiently using a memory according to the conventional MAP algorithm, thereby reducing a required memory size and power. However, the algorithm performs more multiplication operations than the conventional MAP algorithm in LLR calculation, and thus decoding speed is reduced.

SUMMARY OF THE INVENTION

The present invention is directed to an apparatus and method for computing a log likelihood ratio (LLR) capable of increasing decoding speed while improving memory use efficiency in turbo decoding.

The present invention is also directed to an apparatus and method for computing an LLR capable of maintaining decoding efficiency while allowing a simplified hardware configuration.

Thus, the present invention aims to provide an apparatus and method for computing an LLR capable of minimizing multiplication operations and comparison operations.

A method for computing an LLR according to the present invention is based on the spirit of: using the above-described block processing; in order to calculate an LLR, selecting and using one of a plurality of LLR calculation formulae according to the highest transition probability of respective states instead of using a complicated conventional formula.

That is, in order to obtain the highest transition probability of respective states, performing a comparison operation for some of the transition probabilities to determine the highest, selecting one of the other transition probabilities according to the determined high value, and comparing the determined value with the selected value to select the higher value.

One aspect of the present invention provides a method for computing an LLR, comprising the steps of: calculating alpha values, beta values and gamma values of at least two time sections; calculating transition probabilities in the at least two time sections using the alpha values, beta values and gamma values; performing a comparison operation between some of the transition probabilities to determine a high value, selecting one of the other transition probabilities according to the determined high value, comparing the determined high value with the selected value to select a higher value, and thereby obtaining the highest of the transition probabilities; and determining an operation to apply according to the highest transition probability and calculating an LLR.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

The embodiments are described with a detailed process of calculating a log likelihood ratio (LLR) for 4-state transition in two time sections.

A method for computing an LLR according to an exemplary embodiment first calculates an alpha value (forward state metric (FSM)), a beta value (backward state metric (BSM)) and a gamma value (branch metric (BM)) for each state of two time sections from time (k−1) to time (k+1).

Figure 3:
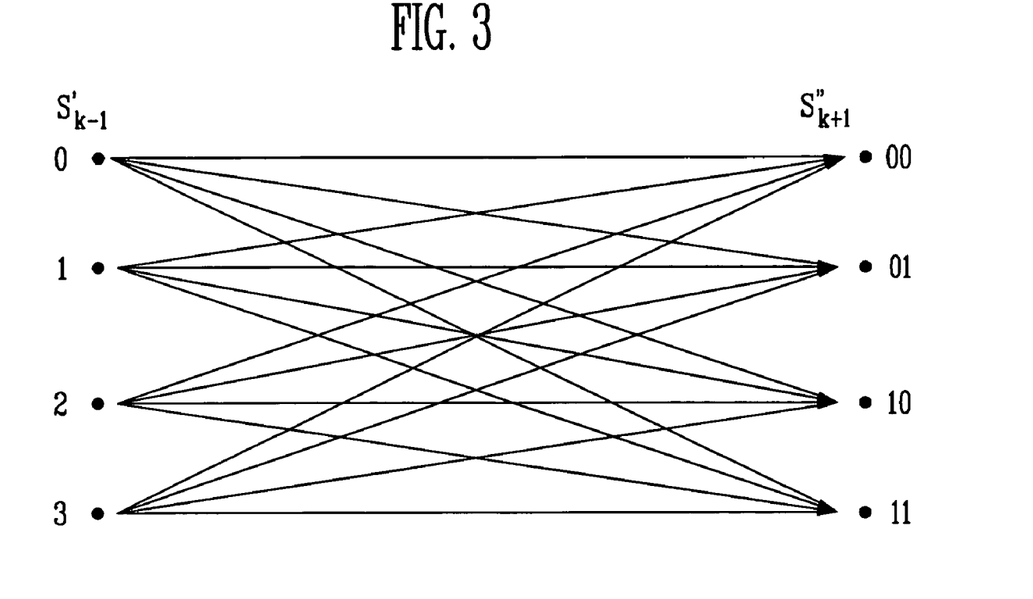
FIG. 3 is a 4-state combined-block trellis diagram from time (k−1) to time (k+1) according to an exemplary embodiment of the present invention.

In this embodiment, a block combination method is used to reduce multiplication operations in a maximum a posteriori (MAP) algorithm employing a block processing method. FIG. 3 is a 4-state trellis diagram from time (k−1) to time (k+1). FIG. 3 illustrates a process of combining two decoding processes into one and performing decoding. Using a gamma value BM defined for every state, an alpha value FSM and a beta value BSM are calculated. The gamma value BM defined for every state is calculated as the product of a gamma value BM from time (k−1) to time k and a gamma value BM from time k to time (k+1). The calculations are made according to Formulae 9 to 11 given below:

$$\gamma_k^{s',s,s''} = \gamma_k^{s',s} \times \gamma_k^{s,s''} \qquad \text{Formula 9}$$

$$= \exp\left\{\frac{2}{\sigma^2}(x_k u_k + y_k v_k + x_{k+1} u_{k+1} + y_{k+1} v_{k+1})\right\}$$

$$\beta_{k-1}(s') = \sum_{all\_s''} \beta_k(s'')\gamma_k(s', s'') \qquad \text{Formula 10}$$

$$\alpha_{k+1}(s) = \sum_{all\_s''} \gamma_k(s', s'')\alpha_{k-1}(s') \qquad \text{Formula 11}$$

$\gamma_k^{s',s''}$ is the combined gamma value obtained by taking the product of the gamma value for transition from state S' at time (k−1) to state S at time k with the gamma value for transition from state S at time k to next state S". Using the combined gamma value, an alpha value and beta value at time (k+1) are obtained. Here, the alpha value and beta value are calculated by the same calculation method as a conventional MAP algorithm. More specifically, alpha denotes a state metric to make transition from all the states at time (k−1) to one state at time (k+1). Likewise, beta is obtained by repetitively using a beta value of a previous state.

Otherwise, alpha and beta may be obtained by the same method as the block processing algorithm described above as improved conventional art using Formula 6 to Formula 8 given above.

When alpha values, beta values and gamma values of respective states are obtained, transition probabilities of the respective states in two time sections are calculated using the obtained values.

When data (0, 0) is received, transition is made from all the four states at time (k−1) to state '0' at time (k+1). When data (0, 1) is received, transition is made to state '1' at time (k+1). When data (1, 0) is received, transition is made to state '2' at time (k+1). When data (1, 1) is received, transition is made to state '3' at time (k+1). Probabilities of transition to the respective states are calculated by Formulae 12 to 15 given below:

$$p(u_k = 00 : y_k) = \sum_{0,0} \alpha_{k-1} \gamma_{s',s''} \beta_{k+1} \qquad \text{Formula 12}$$

$$p(u_k = 01 : y_k) = \sum_{0,1} \alpha_{k-1} \gamma_{s',s''} \beta_{k+1} \qquad \text{Formula 13}$$

-continued $$p(u_k = 10 : y_k) = \sum_{1,0} \alpha_{k-1} \gamma_{s',s''} \beta_{k+1} \quad \text{Formula 14}$$

$$p(u_k = 11 : y_k) = \sum_{1,1} \alpha_{k-1} \gamma_{s',s''} \beta_{k+1} \quad \text{Formula 15}$$

$p(u_k=00:y_k)$ denotes a probability that when data $y_k$ is received, the received data value is (0, 0), and $p(u_k=01:y_k)$ denotes a probability that when data $y_k$ is received, the received data value is (0, 1). Likewise, $p(u_k=10:y_k)$ denotes a probability that received data value is (1, 0), and $p(u_k=11:y_k)$ denotes a probability that received data value is (1, 1).

After the respective probabilities are obtained, the highest among them is determined. The reason why the highest is determined is because when an LLR is calculated by determining a path of transition from time (k−1) to time (k+1), the calculation process varies according to the highest. It is possible to further simplify the process of obtaining the highest using the characteristics of a turbo decoding algorithm. The simplified method of obtaining the highest value is described below.

Figure 4:
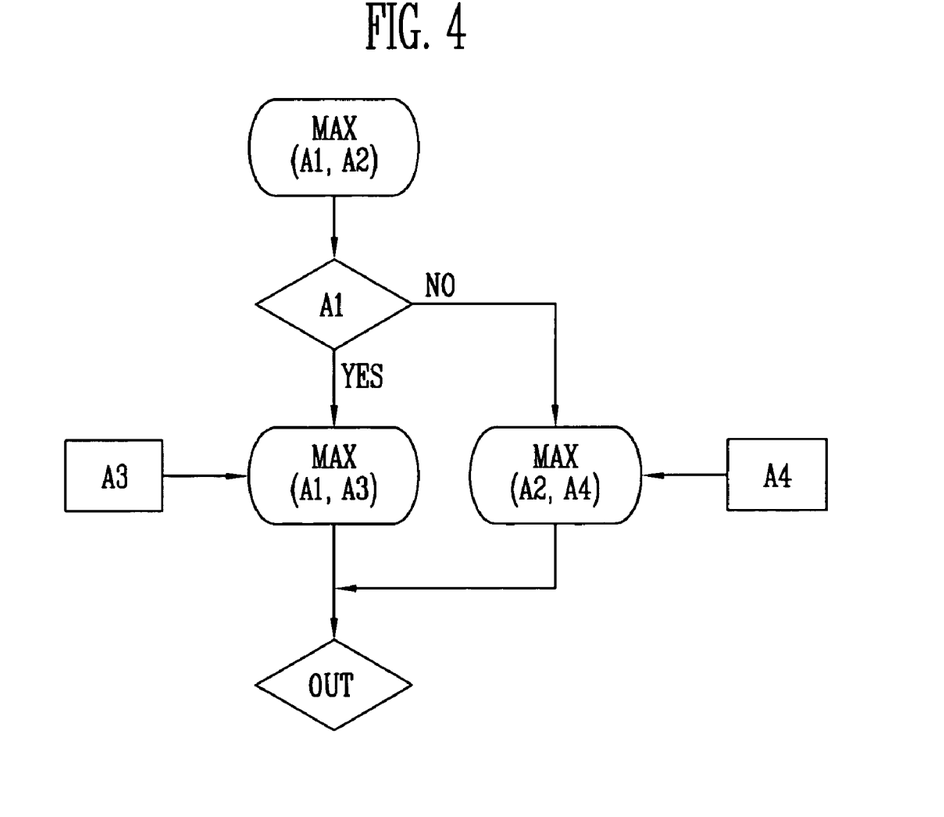
FIG. 4 is a flowchart showing a process of obtaining the highest transition probability according to an exemplary embodiment of the present invention.

FIG. 4 is a flowchart showing a process of obtaining the highest probability by determining the highest transition probability according to this embodiment. As illustrated in FIG. 4, the process of obtaining the highest probability may be divided into the following detailed steps:

a first step of comparing a transition probability to (0, 0) with a transition probability to (0, 1) and selecting the higher value;

a second step of selecting a transition probability to (1, 0) when the transition probability to (0, 0) is more than the transition probability to (0, 1), and selecting a transition probability to (1, 1) when the transition probability to (0, 1) is more than the transition probability to (0, 0); and a third step of selecting the higher one of the selected values of the first step and the second step.

In the first step, A1 is compared with A2, and the higher value is selected and stored as r1. When A1 is selected in the first step, A3 is stored as r2. On the contrary, when A2 is selected in the first step, A4 is stored as r2. In the third step, r1 is finally compared with r2, and the higher value is determined and output.

Figure 5:
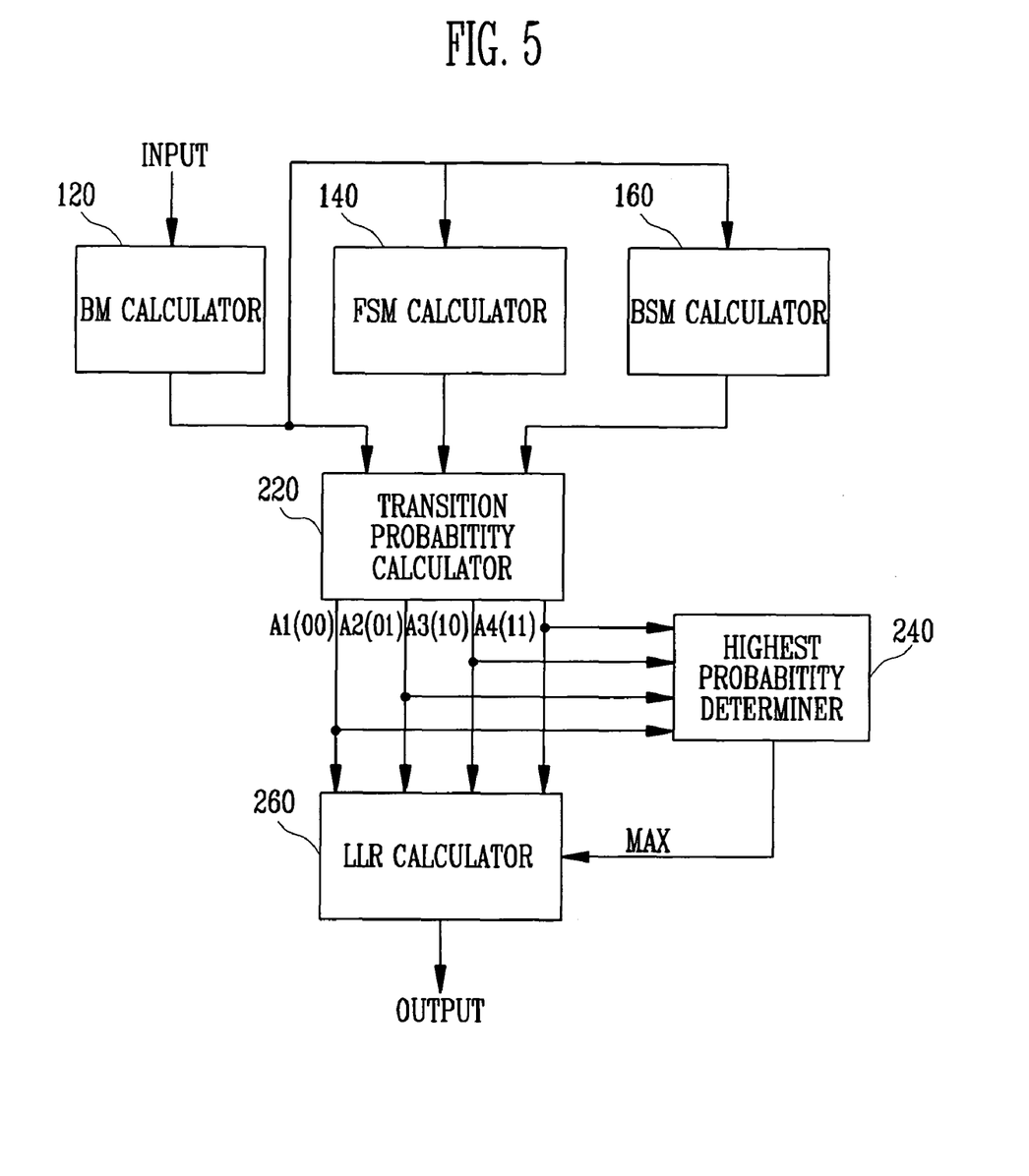
FIG. 5 is a block diagram of an apparatus for computing a log likelihood ratio (LLR) according to an exemplary embodiment of the present invention.
Figure 6:
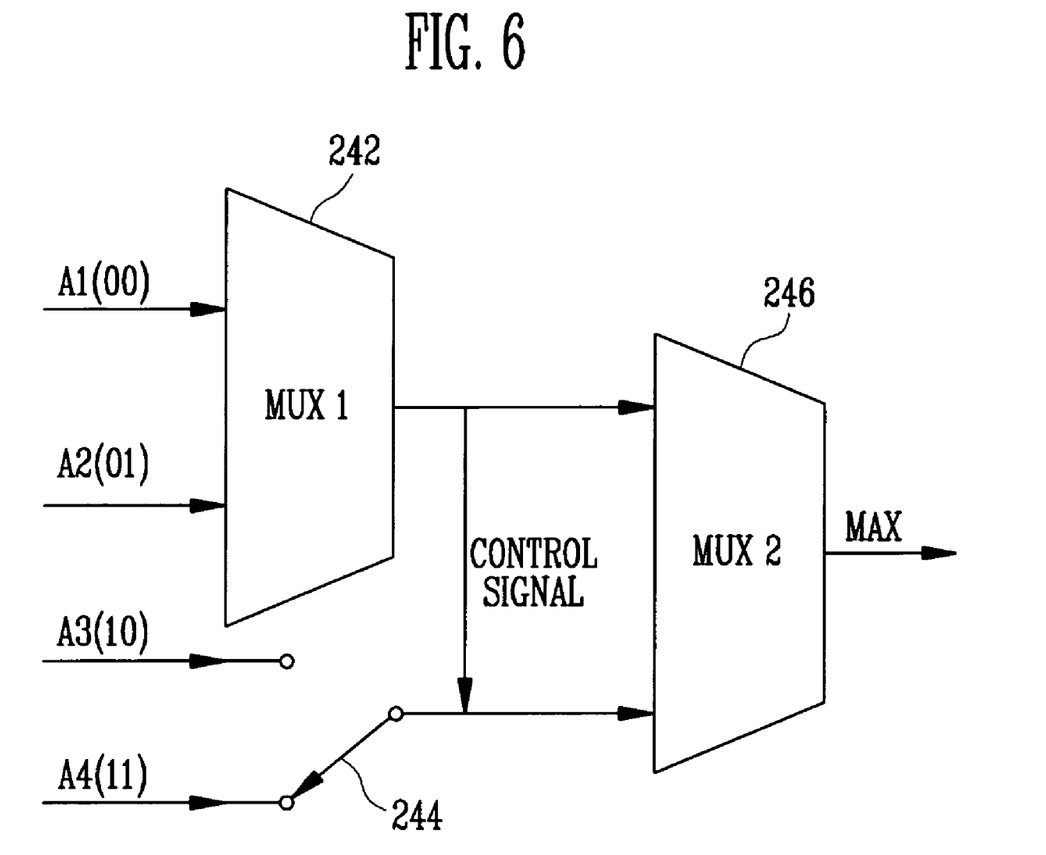
FIG. 6 is a circuit diagram of a transition probability calculator shown in FIG. 5 according to an exemplary embodiment of the present invention.

FIG. 6 illustrates a circuit structure capable of performing the process of obtaining the highest probability. In FIG. 5, among four data A1(0, 0), A2(0, 1), A3(1, 0) and A4(1, 1), A1(0, 0) is compared with A2(0, 1) by MUX1, and one of them is selected. When MUX1 selects A1(0, 0), a control signal automatically selects A3(1, 0). On the contrary, when MUX1 selects A2(0, 1), the control signal automatically selects A4(1, 1). MUX2 selects the higher one of a value selected by MUX1 and a value selected by the control signal and outputs it.

A1(0, 0) is the sum of a probability that first decoding data is '0' and a probability that second decoding data is '0.' In other words, A1(0, 0) is the sum of a probability that $L(u_k)$ is 0 and a probability that $L(u_{k+1})$ is 0. A2(0, 1) is the sum of a probability that first decoding data is '0' and a probability that second decoding data is '1.' A3(1, 0) is the sum of a probability that first decoding data is '1' and a probability that second decoding data is '0.' A4(1, 1) is the sum of a probability that first decoding data is '1' and a probability that second decoding data is '1.'

When MUX1 selects A1(0, 0), the control signal selects A3(1, 0) because A1(0, 0), which is the sum of the probability that $L(u_k)$ is 0 and the probability that $L(u_{k+1})$ is 0, is higher than the sum of the probability that $L(u_k)$ is 0 and the probability that $L(u_{k+1})$ is 1. In other words, since the probability that $L(u_{k+1})$ is 0 is higher than the probability that $L(u_{k+1})$ is 1 while the same probability that $L(u_k)$ is 0 is added, the comparison of the probability that $L(u_{k+1})$ is 1 is removed from the next step and only the probability that $L(u_k)$ is 0 needs to be compared with the probability that $L(u_k)$ is 1. In the result, when A1(0, 0) is selected, the control signal selects A3(1, 0) because only the probability that $L(u_k)$ is 1 needs to be compared with the probability that $L(u_k)$ is 0.

In the same manner, when MUX1 selects A2(0, 1), the control signal selects A4(1, 1). This means that A2(0, 1), which is the sum of the probability that $L(u_k)$ is 0 and the probability that $L(u_{k+1})$ is 1, is higher than the sum of the probability that $L(u_k)$ is 0 and the probability that $L(u_{k+1})$ is 0. In other words, since the probability that $L(u_{k+1})$ is 1 is higher than the probability that $L(u_{k+1})$ is 0 while the same probability that $L(u_k)$ is 0 is added, the comparison of the probability that $L(u_{k+1})$ is 0 is removed from the next step and only the probability that $L(u_k)$ is 0 needs to be compared with the probability that $L(u_k)$ is 1. In the result, when A2(0, 1) is selected, the control signal selects A4(1, 1) because only the probability that $L(u_k)$ is 1 needs to be compared with the probability that $L(u_k)$ is 0.

When the highest probability is determined by the above-described process, an LLR is obtained by a method employing different formulae according to the highest probability. An LLR is calculated by Formulae 16 to 19 given below:

$$case1(p(u_k = 00:y_k)) \quad \text{Formula 16}$$
$$L(u_k) = \log\left(\frac{p(u_k = 10:y_k)}{p(u_k = 00:y_k)}\right),$$
$$L(u_{k+1}) = \log\left(\frac{p(u_k = 01:y_k)}{p(u_k = 00:y_k)}\right)$$

$$case2(p(u_k = 01:y_k)) \quad \text{Formula 17}$$
$$L(u_k) = \log\left(\frac{p(u_k = 11:y_k)}{p(u_k = 01:y_k)}\right),$$
$$L(u_{k+1}) = \log\left(\frac{p(u_k = 01:y_k)}{p(u_k = 00:y_k)}\right)$$

$$case3(p(u_k = 10:y_k)) \quad \text{Formula 18}$$
$$L(u_k) = \log\left(\frac{p(u_k = 10:y_k)}{p(u_k = 00:y_k)}\right),$$
$$L(u_{k+1}) = \log\left(\frac{p(u_k = 11:y_k)}{p(u_k = 10:y_k)}\right)$$

$$case4(p(u_k = 11:y_k)) \quad \text{Formula 19}$$
$$L(u_k) = \log\left(\frac{p(u_k = 11:y_k)}{p(u_k = 01:y_k)}\right),$$
$$L(u_{k+1}) = \log\left(\frac{p(u_k = 11:y_k)}{p(u_k = 10:y_k)}\right)$$

$L(u_k)$ is a value decoded at time k, and $L(u_{k+1})$ is a value decoded at time (k+1). In $L(u_k)$ of case1, $p(u_k=00: y_k)$ is obtained by multiplying a probability of receiving '0' and making transition from time (k−1) to time k by a probability of receiving '0' and making transition from time k to time (k+1). Thus, a value decoded at time (k+1) should be counterbalanced. Consequently, $p(u_k=10: y_k)$ is divided by $p(u_k=00: y_k)$ as shown in Formula 16.

In this manner, the decoded value $L(u_k)$ can be obtained. Likewise, $L(u_{k+1})$ can be also obtained by counterbalancing a probability of transition from time (k−1) to time k. In the same way, $L(u_k)$ and $L(u_{k+1})$ are calculated in case2, case3 and case4 as well.

Meanwhile, Formula 12 may be simplified as shown in Formula 20 given below:

$$p(u_k = 00: y_k) = \sum_{0,0} \alpha_{k-1} \gamma_{s',s''} \beta_{k+1} \quad \text{Formula 20}$$

$$= \alpha_{k-1}(0)\gamma_{0,0}\beta_{k+1}(0) +$$
$$\alpha_{k-1}(1)\gamma_{1,0}\beta_{k+1}(0) + \alpha_{k-1}(2)\gamma_{2,0}\beta_{k+1}(0) +$$
$$\alpha_{k-1}(3)\gamma_{3,0}\beta_{k+1}(0)$$
$$= \begin{pmatrix} \alpha_{k-1}(0)\gamma_{0,0} + \alpha_{k-1}(1)\gamma_{1,0} + \alpha_{k-1}(2)\gamma_{2,0} + \\ \alpha_{k-1}(3)\gamma_{3,0} \end{pmatrix} \times$$
$$\beta_{k+1}(0)$$
$$= \alpha_{k+1}(0) \times \beta_{k+1}(0)$$

In Formula 20, since an alpha value at time (k+1) includes alpha values of all previous states, a probability that received data is (0, 0) can be simplified using only alpha and beta of a current state. Likewise, Formulae 13 to 15 can be simplified.

An exemplary embodiment of an apparatus for computing LLR to perform the above-described LLR computing method is shown in FIG. 5. The illustrated apparatus for computing an LLR comprises an FSM calculator 140, a BSM calculator 160, a BM calculator 120, a transition probability calculator 220, a highest probability determiner 240, and an LLR calculator 260. The FSM calculator 140 calculates alpha values of at least two time sections. The BSM calculator 160 calculates beta values of the at least two time sections. The BM calculator 120 calculates gamma values of the at least two time sections. The transition probability calculator 220 calculates transition probabilities of respective states in the at least two time sections using the alpha, beta and gamma values. The highest probability determiner 240 determines the highest of the transition probabilities. The LLR calculator 260 performs an operation specified according to the highest probability, thereby calculating an LLR.

The BM calculator 120 calculates gamma values of the at least two time sections using Formula 9 according to the block processing algorithm.

The FSM calculator 140 receives the gamma values calculated by the BM calculator 120 and applies Formula 11 according to the block processing algorithm, thereby calculating alpha values of at least two time sections.

The BSM calculator 160 receives the gamma values calculated by the BM calculator 120 and applies Formula 10 according to the block processing algorithm, thereby calculating beta values of the at least two time sections.

The transition probability calculator 220 receives the gamma, alpha and beta values calculated by the BM calculator 120, the FSM calculator 140 and the BSM calculator 160 and applies Formulae 12 to 15, thereby calculating transition probabilities.

An exemplary embodiment of the highest probability determiner 240 used in the LLR computing apparatus of FIG. 5 is shown in FIG. 6. The illustrated highest probability determiner 240 includes a first comparator 242, a switch 244, and a second comparator 246. The first comparator 242 compares a transition probability to (0, 0) with a transition probability to (0, 1) and selects the higher value. The switch 244 selects a transition probability to (1, 0) when the value selected by the first comparator 242 is (0, 0) and selects a transition probability to (1, 1) when the value selected by the selected by the first comparator 242 with the value selected by the switch 244 first comparator 242 is (0, 1). The second comparator 246 compares the value and selects the higher value.

The LLR calculator 260 selects and applies one of Formulae 16 to 19 according to the determination result of the highest probability determiner 240, thereby calculating an LLR.

Operation of the LLR calculator illustrated in FIG. 5 can be easily deduced from the description of the present invention and thus will be omitted.

According to the LLR computing method and apparatus having the above-described structure, it is possible to efficiently calculate an LLR in an LLR calculation structure.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of computing a log likelihood ratio (LLR) being executed on an apparatus for computing the LLR, the method comprising:

(a) calculating alpha values, beta values and gamma values of at least two time sections;

(b) calculating transition probabilities in the at least two time sections using the alpha values, beta values and gamma values;

(c) performing a comparison operation between some of the transition probabilities to determine a high value, selecting one of the other transition probabilities according to the determined high value, comparing the determined high value with the selected value to select a higher value, and thereby obtaining the highest of the transition probabilities; and (d) determining an operation to apply according to the highest transition probability and calculating an LLR, wherein (a) and (b) are performed for values (0, 0), (0, 1), (1, 0) and (1, 1) in two time sections, and wherein (c) comprises:

(c1) comparing a transition probability to (0, 0) with a transition probability to (0, 1) and selecting the higher value;

(c2) selecting a transition probability to (1, 0) when the transition probability to (0, 0) is higher than the transition probability to (0, 1), and selecting a transition probability to (1, 1) when the transition probability to (0, 1) is higher than the transition probability to (0, 0); and (c3) selecting the higher of the value selected in (c1) and the value selected in (c2) as the highest transition probability.

2. The method of claim 1, wherein (a) is performed by applying formulae given below:

$$\gamma_k^{s',s,s''} = \gamma_k^{s',s} \times \gamma_k^{s,s''}$$
$$= \exp\left\{\frac{2}{\sigma^2}(x_k u_k + y_k v_k + x_{k+1} u_{k+1} + y_{k+1} v_{k+1})\right\}$$

-continued $$\beta_{k-1}(s') = \sum_{all\_s''} \beta_k(s'')\gamma_k(s', s'')$$

$$\alpha_{k+1}(s) = \sum_{all\_s''} \gamma_k(s', s'')\alpha_{k-1}(s')$$

where S is state at time K, S' is state at time (K−1), S" is state at time (K+1), $u_k$ is data bit, $v_k$ is parity bit, $x_k$ is data bit mixed with noise passed through a channel, and $y_k$ is parity bit mixed with noise passed through a channel.

3. The method of claim 1, wherein (b) is performed by applying formulae given below:

$$p(u_k = 00:y_k) = \sum_{0,0} \alpha_{k-1}\gamma_{s',s''}\beta_{k+1}$$

$$p(u_k = 01:y_k) = \sum_{0,1} \alpha_{k-1}\gamma_{s',s''}\beta_{k+1}$$

$$p(u_k = 10:y_k) = \sum_{1,0} \alpha_{k-1}\gamma_{s',s''}\beta_{k+1}$$

$$p(u_k = 11:y_k) = \sum_{1,1} \alpha_{k-1}\gamma_{s',s''}\beta_{k+1}$$

wherein $p(u_k = 00:y_k)$ is probability that when data $y_k$ is received, the received data value is (0, 0), $p(u_k = 01:y_k)$ is probability that when data $y_k$ is received, the received data value is (0, 1), $p(u_k = 10:y_k)$ is probability that when data $y_k$ is received, the received data value is (1, 0), and $p(u_k = 11:y_k)$: probability that when data $y_k$ is received, the received data value is (1, 1).

4. The method of claim 1, wherein (d) is performed by applying one of the following formulae selected according to the highest transition probability obtained in (c):

$$case1(p(u_k = 00:y_k))$$

$$L(u_k) = \log\left(\frac{p(u_k = 10:y_k)}{p(u_k = 00:y_k)}\right),$$

$$L(u_{k+1}) = \log\left(\frac{p(u_k = 01:y_k)}{p(u_k = 00:y_k)}\right)$$

$$case2(p(u_k = 01:y_k))$$

$$L(u_k) = \log\left(\frac{p(u_k = 11:y_k)}{p(u_k = 01:y_k)}\right),$$

$$L(u_{k+1}) = \log\left(\frac{p(u_k = 01:y_k)}{p(u_k = 00:y_k)}\right)$$

$$case3(p(u_k = 10:y_k))$$

$$L(u_k) = \log\left(\frac{p(u_k = 10:y_k)}{p(u_k = 00:y_k)}\right),$$

$$L(u_{k+1}) = \log\left(\frac{p(u_k = 11:y_k)}{p(u_k = 10:y_k)}\right)$$

$$case4(p(u_k = 11:y_k))$$

$$L(u_k) = \log\left(\frac{p(u_k = 11:y_k)}{p(u_k = 01:y_k)}\right),$$

$$L(u_{k+1}) = \log\left(\frac{p(u_k = 11:y_k)}{p(u_k = 10:y_k)}\right)$$

where $u_k$ is data bit, $v_k$ is parity bit mixed with noise passed through a channel, $p(u_k = 00:y_k)$ is probability that when data $y_k$ is received, the received data value is (0, 0), $p(u_k = 01:y_k)$ is probability that when data $y_k$ is received, the received data value is (0, 1), $p(u_k = 10:y_k)$ is probability that when data $y_k$ is received, the received data value is (1, 0), and $p(u_k = 11:y_k)$: probability that when data $y_k$ is received, the received data value is (1, 1).

5. An apparatus for computing a log likelihood ratio (LLR), comprising:
a forward state metric (FSM) calculator that calculates alpha values of at least two time sections;
a backward state metric (BSM) calculator that calculates beta values of the at least two time sections;
a branch metric (BM) calculator that calculates gamma values of the at least two time sections;
a transition probability calculator that calculates transition probabilities of respective states in the at least two time sections using the alpha, beta and gamma values;
a highest probability determiner that calculates the highest of the transition probabilities; and
an LLR calculator that calculates an operation specified according to the highest transition probability to calculate an LLR,
wherein the highest probability determiner comprises:
a first comparator that compares a transition probability to (0, 0) with a transition probability to (0, 1) and selects the higher value;
a switch that selects a transition probability to (1, 0) when the first comparator selects the transition probability to (0, 0), and selects a transition probability to (1, 1) when the first comparator selects the transition probability to (0, 1); and
a second comparator that compares the value selected by the first comparator with the value selected by the switch and selects the higher value.

6. The apparatus of claim 5, wherein the BM calculator applies a formula given below and calculates the gamma values of the at least two time sections:

$$\gamma_k^{s',s,s''} = \gamma_k^{s',s} \times \gamma_k^{s,s''} = \exp\left\{\frac{2}{\sigma^2}(x_k u_k + y_k v_k + x_{k+1} u_{k+1} + y_{k+1} v_{k+1})\right\}$$

where S is state at time K, S' is state at time (K−1), S" is state at time (K+1), $u_k$ is data bit, $v_k$ is parity bit, $x_k$ is data bit mixed with noise passed through a channel, and $y_k$ is parity bit mixed with noise passed through a channel.

7. The apparatus of claim 6, wherein the FSM calculator applies a formula given below and calculates the alpha values of the at least two time sections:

$$\alpha_{k+1}(s) = \sum_{all\_s''} \gamma_k(s', s'')\alpha_{k-1}(s').$$

8. The apparatus of claim 6, wherein the BSM calculator applies a formula given below and calculates the beta values of the at least two time sections:

$$\beta_{k-1}(s') = \sum_{all\_s''} \beta_k(s'')\gamma_k(s', s'').$$

9. The apparatus of claim 6, wherein the transition probability calculator applies formulae given below and calculates the transition probabilities of the at least two time sections:

$$p(u_k = 00 : y_k) = \sum_{0,0} \alpha_{k-1} \gamma_{s',s''} \beta_{k+1}$$

$$p(u_k = 01 : y_k) = \sum_{0,1} \alpha_{k-1} \gamma_{s',s''} \beta_{k+1}$$

$$p(u_k = 10 : y_k) = \sum_{1,0} \alpha_{k-1} \gamma_{s',s''} \beta_{k+1}$$

$$p(u_k = 11 : y_k) = \sum_{1,1} \alpha_{k-1} \gamma_{s',s''} \beta_{k+1}.$$

10. The apparatus of claim 6, wherein the LLR calculator applies one of the following formulae selected according to the maximum transition probability determined by the highest probability determiner and performs the operation:

$case1(p(u_k = 00 : y_k))$ $$L(u_k) = \log\left(\frac{p(u_k = 10 : y_k)}{p(u_k = 00 : y_k)}\right), \quad L(u_{k+1}) = \log\left(\frac{p(u_k = 01 : y_k)}{p(u_k = 00 : y_k)}\right)$$

$case2(p(u_k = 01 : y_k))$ $$L(u_k) = \log\left(\frac{p(u_k = 11 : y_k)}{p(u_k = 01 : y_k)}\right), \quad L(u_{k+1}) = \log\left(\frac{p(u_k = 01 : y_k)}{p(u_k = 00 : y_k)}\right)$$

$case3(p(u_k = 10 : y_k))$ $$L(u_k) = \log\left(\frac{p(u_k = 10 : y_k)}{p(u_k = 00 : y_k)}\right), \quad L(u_{k+1}) = \log\left(\frac{p(u_k = 11 : y_k)}{p(u_k = 10 : y_k)}\right)$$

$case4(p(u_k = 11 : y_k))$ $$L(u_k) = \log\left(\frac{p(u_k = 11 : y_k)}{p(u_k = 01 : y_k)}\right), \quad L(u_{k+1}) = \log\left(\frac{p(u_k = 11 : y_k)}{p(u_k = 10 : y_k)}\right).$$

* * * * *